(12) United States Patent
Hartjes

(10) Patent No.: US 11,467,500 B2
(45) Date of Patent: Oct. 11, 2022

(54) OPTICAL ARRANGEMENT AND METHOD FOR REPAIRING THE OPTICAL ARRANGEMENT AFTER A SHOCK LOAD

(71) Applicant: Carl Zeiss SMT GmbH, Oberkochen (DE)

(72) Inventor: Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 299 days.

(21) Appl. No.: 16/814,169

(22) Filed: Mar. 10, 2020

(65) Prior Publication Data
US 2020/0209758 A1    Jul. 2, 2020

Related U.S. Application Data

(63) Continuation of application No. PCT/EP2018/070627, filed on Jul. 30, 2018.

(30) Foreign Application Priority Data

Sep. 18, 2017   (DE) .......................... 102017216498.0

(51) Int. Cl.
*G03F 7/20* (2006.01)
*G02B 5/08* (2006.01)
*G02B 7/182* (2021.01)

(52) U.S. Cl.
CPC ......... *G03F 7/7015* (2013.01); *G02B 5/0891* (2013.01); *G02B 7/182* (2013.01)

(58) Field of Classification Search
CPC .............. G03F 7/7015; G03F 7/70258; G03F 7/70825; G02B 5/0891; G02B 7/182; G02B 26/085
See application file for complete search history.

(56) References Cited

U.S. PATENT DOCUMENTS

| | | | | |
|---|---|---|---|---|
| 9,216,045 | B2* | 12/2015 | Martineau | ............... B22F 7/008 |
| 10,095,126 | B2* | 10/2018 | Prochnau | ............... G03F 7/709 |
| 10,563,538 | B2* | 2/2020 | Birnkrant | ............... F01D 25/04 |

FOREIGN PATENT DOCUMENTS

| | | |
|---|---|---|
| DE | 102015224743 A1 | 10/2016 |
| DE | 102016201316 A1 | 1/2017 |

(Continued)

OTHER PUBLICATIONS

German Office Action, with translation thereof, for corresponding DE Appl No. 10 2017 216 498.0, dated Feb. 23, 2018.

(Continued)

*Primary Examiner* — Hung V Nguyen
(74) *Attorney, Agent, or Firm* — Fish & Richardson P.C.

(57) ABSTRACT

An optical arrangement, in particular to a lithography system, includes: a first component, in particular a carrying frame; a second component which is movable relative to the first component, in particular a mirror or a housing; and at least one stop having at least one stop face for limiting the movement of the second component in relation to the first component. The stop includes a metal foam for absorbing the kinetic energy of the second component when it strikes against the stop face. A method for repairing an optical arrangement of this kind after a shock load includes replacing at least one stop, in which the metal foam was compressed under the shock load, with a stop in which the metal foam is not compressed.

19 Claims, 2 Drawing Sheets

(56) References Cited

FOREIGN PATENT DOCUMENTS

DE  102017200633 A1  3/2017
DE  102017200638 A1  3/2017

OTHER PUBLICATIONS

Gibson et al., "Cellular Solids: Structure and Properties," Cambridge University Press, 1999; Abstract only.
P. Schuler, "Mechanische Eigenschaften und Versagensmechanismen Offenzelliger Aluminiumschaum-Strukturen" (Mechanical properties and failure behaviour of open cell Aluminium foam structures), Berlin 2016, Abstract only, p. iii.
Translation of International Search Report for corresponding PCT Appl No. PCT/EP2018/070627, dated Nov. 13, 2018.
S. von der Weiden, "Metal foam for the spinal column [Metallschaum fur die Wirbelsaule]", WELT Print Wissen, Sep. 24, 2009. (translation).
A.M. Matz, "Innovative Materials Science With The Plaything From Childhood [Innovative Werkstoffkunde mit dem Spielzeug aus der Kindheit]" Konturen 2011, pp. 68-71, Pforzheim University. (translation).
"Stable Metal Foam For Lightweight Construction And Impact protection [Stabiler Metallschaum für Leichtbau und Aufprallschutz]", MET ALL 2013 (www.bauforum.at/metall/stabiler-metallschaum-fuer-Leichtbau-und-aufprallschutz-19861). (translation).
J. Burzer, "On the possibility of using metal foams in traffic engineering [Zur Einsetzbarkeit von Metallschaumen in der Verkehrstechnik]", Univ. Bayreuth, 2000. (translation).
T. Hipke et al., "Handbook of aluminum foams [Taschenbuch fur Aluminiumschaume]", Beuth-Verlag, 2011. (translation).

* cited by examiner

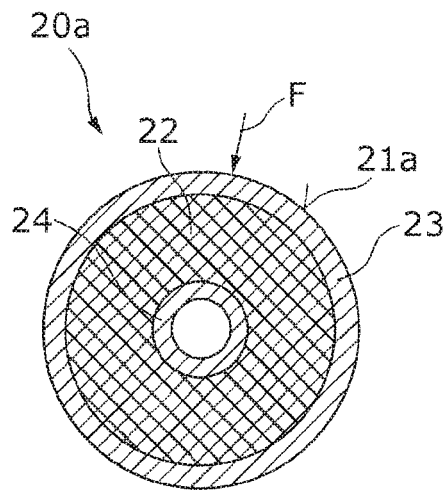
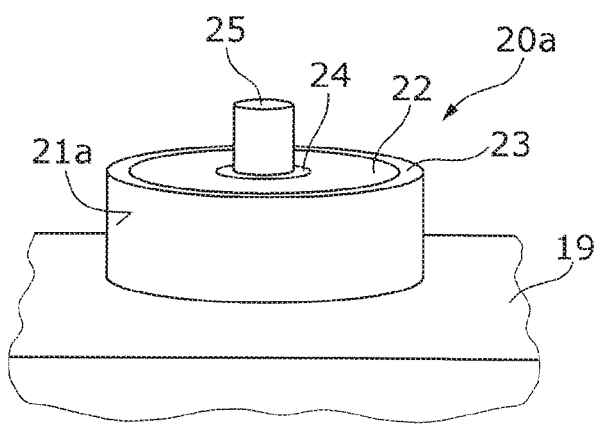
Fig. 2A    Fig. 2B
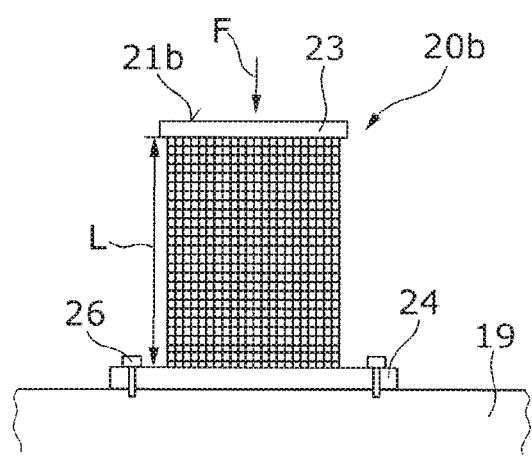
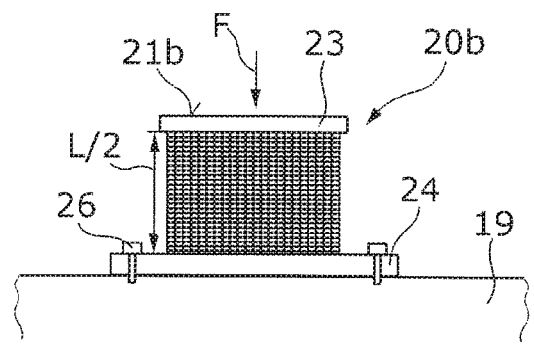
Fig. 3A    Fig. 3B

OPTICAL ARRANGEMENT AND METHOD FOR REPAIRING THE OPTICAL ARRANGEMENT AFTER A SHOCK LOAD

CROSS-REFERENCE TO RELATED APPLICATIONS

The present application is a continuation of, and claims benefit under 35 USC 120 to, international application PCT/EP2018/070627, filed Jul. 30, 2018, which claims benefit under 35 USC 119 of German Application No. 10 2017 216 498.0 of Sep. 18, 2017. The entire disclosure of these applications are incorporated by reference herein.

FIELD

The disclosure relates to an optical arrangement, for example a lithography system, in particular an EUV or DUV lithography system, including: a first component, in particular a carrying frame, a second component, which is movable in relation to the first component, in particular a mirror or a housing, and also at least one stop with at least one stop face for limiting the movement of the second component in relation to the first component. The disclosure also relates to a method for repairing such an optical arrangement following a shock load.

BACKGROUND

For the purposes of this application, a lithography system is understood as meaning an optical system or an optical arrangement that can be used in the field of lithography. Apart from a lithography apparatus, which serves for the production of semiconductor components, the optical system may be for example an inspection system for the inspection of a photomask used in a lithography apparatus (hereinafter also referred to as a reticle), for the inspection of a semiconductor substrate to be structured (hereinafter also referred to as a wafer), or a metrology system, which is used for measuring a lithography apparatus or parts thereof, for example for measuring a projection system. The optical arrangement or the lithography system may be in particular an EUV lithography system, which is designed for used radiation at wavelengths in the EUV wavelength range of between about 5 nm and about 30 nm.

Reference is often made hereinafter to a movable (second) component or a moved/movable object in the form of an (EUV) mirror. In principle, however, the movable component may also be any other object or any other component or subassembly, for example an optical element such as a lens or a prism, a wafer stage, a further carrying frame or a further carrying structure for optical or non-optical components, etc.

The first component may be for example a carrying frame (known as a "force frame") of the optical arrangement, which substantially absorbs all of the forces acting on the optical arrangement. The movable component is typically spring-mounted with respect to the carrying frame, or mechanically decoupled from it, so that ideally no forces or vibrations are transmitted from the carrying frame to the movable component. The first component may, however, also be some other component, for example a carrier component part, which is spring-mounted with respect to the carrying frame of the optical arrangement or mechanically decoupled from it.

In the case of an EUV lithography apparatus, specifically in the case of an EUV lens for imaging of a mask onto a light-sensitive substrate, the sensitivity of the quality of the imaging with respect to the deformation of optical surfaces of EUV mirrors is particularly great. Therefore, during the operation of an EUV lithography apparatus or an EUV lens, EUV mirrors are set in a suspended state, so that the forces and moments acting on the EUV mirror become as small as possible. This state of suspension or of being mechanically decoupled from the environment has the consequence that the EUV mirrors can in effect move freely between their end positions, which are typically defined by (end) stops or the positions of the stop faces thereof, and may collide with the (end) stops.

A collision of the EUV mirrors with the (end) stops typically only occurs when there is an unwanted shock load, such as occurs in an earthquake or possibly during transportation of the EUV lithography system. If the stops for limiting the travel are embodied as hard mechanical stops, the kinetic energy of the accelerated EUV mirror is not absorbed under such a shock load and a high energetic impulse is introduced into the optical arrangement, which may lead to collisions of the EUV mirrors with optics modules or optics components within the optical arrangement. The collisions can lead to mechanical deformations or damage to the EUV mirrors or to other component parts of the optical arrangement.

The second component can also be a housing or any other component part or a system or an interconnected group of component parts, in particular a complete system consisting of a plurality of component parts, for example a lithography illumination system, which is mounted or arranged on a carrying frame or on a carrying structure (base frame). In this case, the second component can be, for example, a housing in which the optical elements and further component parts of the illumination system are accommodated. The second component has a very large mass in this case, which is why a very complex damping system involving much installation space, for example hydraulic damping, which additionally has to be sealed against the atmosphere, is typically used to protect against a shock load.

SUMMARY

The disclosure seeks to provide an optical arrangement in which undesired damage to component parts in the case of a shock load is avoided, and to provide a method for repairing such an optical arrangement following a shock load.

In one aspect, the disclosure provides an optical arrangement in which the stop has a metal foam for absorbing the kinetic energy (or as much of the kinetic energy as possible) of the second component when striking against the stop face. Such a stop enables damping by energy dissipation.

The metal foam is typically a molded body which is plastically deformed or compressed when the second component strikes the stop face. The compression occurs substantially along the direction of force of the force generated by the movable component when striking against the stop face. The use of a stop including a metal foam is advantageous over the use of stops including elastomers, e.g., rubber, for damping or absorbing the kinetic energy in that an element made of metal foam has almost the same stiffness in the installed state as an element of a comparable size made of a solid material. On account of the comparatively high stiffness, the desired precision for observing the installation tolerances when installing the stop in the optical arrangement can be observed.

According to the book "Cellular solids: Structure and properties" by L. J. Gibson and M. F. Ashby, Cambridge University Press, 1997, the solid foams belong to the so-called cellular materials, which in turn are defined by a relative density of less than 30%. The relative density is understood to mean the ratio of the density of the cellular material to the density of the material from which the cell walls of the cellular material were produced. Materials with a relatively high relative density are called "porous solids". In the present application, a foam is understood to be a solid which is defined as described above, i.e., which has a relative density of less than 30%.

Metal foams can be produced in a comparatively simple manner, cf., for example, the article "Metallschaum für die Wirbelsäule" by S. von der Weiden, WELT Print Wissen, Sep. 24, 2009. In principle, the type of process for producing metal foams makes it possible to produce metal foams of very different porosity, pore size and metal web thickness, which are adapted to the respective desired properties, cf., for example, the article "Innovative Werkstoffkunde mit dem Spielzeug aus der Kindheit" by Dipl.-Ing. (F. H.) A. M. Matz, Konturen 2011, pages 68-71, Pforzheim University. The properties of the metal foam can therefore be adapted to the desired properties of the stop at a particular installation position by way of a suitable choice of the parameters during its production. The structure and processes for the production of open-cell aluminum foams also emerge from the dissertation "Mechanische Eigenschaften and Versagensmechanismen offenzelliger Aluminiumschaum-Strukturen" by Paul Schüler, Univ. Berlin, 2016. In respect of the characterization of energy absorption properties of metal foams, reference is made to the dissertation "Zur Einsetzbarkeit von Metallschäumen in der Verkehrstechnik" by J. Burzer, Univ. Bayreuth, 2000.

In one embodiment, the stop is detachably connected to the first component, preferably via a screw connection. When the metal foam is compressed by the second component striking against the stop face, the metal foam is plastically deformed or compressed, with the volume of the metal foam decreasing. Following the mechanical deformation or compression, the metal foam thus no longer assumes its original volume, and so the stop typically has to be replaced after a shock load. Such a replacement of the stop is simplified by the—direct or indirect—detachable connection of the stop or of the metal foam to the first component.

In a further embodiment, the stop has a solid connecting component part, which is preferably metallic, via which the stop is connected to the first component. Within the scope of this application, a solid component part is understood to mean a component part in which at least 99% of the volume consists of the respective material, e.g., metallic material, and only less than 1% of the volume consists of air or cavities.

In principle, it is possible to mechanically process the metal foam and, for example, to drill holes in the metal foam in order to connect the latter to the first component. In order to avoid damage to the metal foam, it was found to be advantageous if the metal foam is connected to the first component via a solid connecting component part. In particular, one or more bores for fastening the stop using a screw connection can be provided in such a solid connecting component part. There may be female threads in the bores, although this is not mandatory. The connecting component part itself may also have a geometry that facilitates an interlocking and/or force fit connection to the first component.

In one embodiment, the stop has a solid stop component part, which is preferably metallic, on which the stop face is formed. It was found to be advantageous if the metal foam of the stop does not come into direct contact with the second component when the second component strikes against the stop face. The stop component part and/or the connecting component part can form a cover layer for the metal foam and can be formed, for example, from a metallic material, e.g., from aluminum or from steel, but possibly also from a non-metallic material, e.g., from plastic or from carbon fibers.

In a further embodiment, the metal foam is attached between the stop component part and the connecting component part, i.e., the stop component part and the connecting component part extend at least in part along surfaces of the metal foam that lie opposite one another. The use of a stop in such a sandwich construction, which has a core made of metal foam, which is attached between the stop component part and the connecting component part, facilitates a particularly compact construction of the stop. When the second component strikes against the stop face, the metal foam is typically compressed along a direction of force which (locally) extends at an angle, in particular perpendicular, to the stop face.

It was found to be advantageous if the connecting component part and the stop component part, between which the metal foam is disposed, have the same geometry.

In one embodiment, the stop component part and the connecting component part have a cylindrical embodiment. In this case, the metal foam is introduced into the interspace between the radially inner connecting component part and the radially outer stop component part (or vice versa). In this case, the stop is disposed relative to the second component in such a way that the force exerted by the second component against the stop face upon impact acts substantially with a radial force component on the stop, i.e., the metal foam is substantially compressed in the radial direction.

In this case, the cylindrical connecting component part forms a sleeve which can be pushed onto a suitably shaped, typically rod-shaped component part of the first component. The rod-shaped component part can project beyond the stop or beyond the connecting component part, e.g., in the axial direction, and can be provided with a thread, at least in the projecting section, it being possible to screw a nut onto the thread in order to fasten the stop to the first component in the axial direction. When fastening in the axial direction, the lock nut substantially presses against the end face of the rigid connecting component part and not against the metal foam, as the latter would deform plastically. It is understood that there can be connections other than a screw connection for detachably connecting the stop to the first component, for example a latching connection.

In an alternative embodiment, the stop component part and the connecting component part have a slab-shaped embodiment, i.e., the stop component part and the connecting component part are embodied as plane plates. In this case, the connecting component part can project for example laterally beyond the metal foam in order to (releasably) connect the connection component part to the first component. In this case, the force which is exerted by the second component on the first component upon impact acts substantially perpendicular to the flat stop component part, and so the volume of the metal foam located between the stop component part and the connecting component part is compressed in the longitudinal direction.

In a further embodiment, the stop component part and/or the connecting component part are/is connected to the metal foam in an integral manner, in particular via a metallurgical integral connection. In this case, the metal foam forms a metal foam composite with the stop component part and the connecting component part. The integral connection between the metal foam and the stop component part or the connecting component part is preferably realized via a metallurgical connection, i.e., via a connection in which the respective (generally metallic) stop or connecting component part is heated together with the metal foam to a temperature at which a permanent connection is established with the metal foam without an additional joining agent being used for this purpose. Where desired, the integral connection can also be established using a joining agent, for example an adhesive. However, realizing the integral connection using an adhesive is problematic due to the fact that adhesives generally outgas substances that are undesirably released into the environment. This can be particularly problematic in EUV lithography apparatuses as high demands are placed there on the cleanliness of the vacuum environment under which the optical elements are operated.

In a further embodiment, the metal foam contains aluminum. In particular, the metal foam can consist of aluminum or of an aluminum-containing alloy. For the purposes of selecting an aluminum foam that is suitable for the present application, reference can be made, for example, to the specialist book "Taschenbuch für Aluminiumschäume" by T. Hipke et al., Beuth-Verlag, 2011, which provides a systematic summary of the most important information on the use of aluminum foams. However, it is understood that the metal foam can also contain or consist of other metallic materials, for example nickel, etc.

A so-called hybrid foam can possibly also be used to absorb relatively large loads; here, the aluminum frame of the metal foam is coated by a very thin layer, for example made of nickel, as described in the article "Stabiler Metallschaum für Leichtbau und Aufprallschutz" in the specialist journal METALL 2013 (www.bauforum.at/metall/stabiler-metallschaum-fuer-Leichtbau-und-aufprallschutz-19861). As can be gathered from the dissertation "Mechanische Eigenschaften und Versagensmechanismen offenzelliger Aluminiumschaum-Strukturen" by Paul Schiller, Univ. Berlin, 2016 (cf. FIG. 88 therein), cited at the outset, a mass-specific energy absorption of the order of more than approximately 1.5 kJ/kg can be obtained for aluminum foams in the case of a degree of compression (i.e., a length reduction in the direction of compression) of more than 50%.

The stop is desirably designed or dimensioned in such a way that as much kinetic energy of the second component as possible is absorbed by the metal foam in the case of a shock load caused by an earthquake, for example. Assuming an accelerated mass of the second component of approximately 2000 kg, as may be the case for a second component in the form of a housing of an optical system, for example an illumination system containing one or more mirrors, and an acceleration of approx. 40 m/s$^2$ (corresponding to approximately four times the acceleration due to gravity g) over a time interval of 0.020 s, this corresponds to a speed v of 0.8 m/s. In the present case, the formula for the kinetic energy E=½ mv$^2$ yields E=½*2000 kg*(0.8 m/s)$^2$=640 J. With a mass-specific energy absorption of approximately 1.5 kJ/kg for the metal foam, the mass m of the metal foam arises as 640 J/(1500 J/kg)=0.42 kg. A metal foam with such a weight has manageable dimensions in terms of its volume, and so, despite little installation space available, the use of a metal foam facilitates the realization of a stop that absorbs a considerable proportion of the kinetic energy of the second component.

A further aspect of the disclosure relates to a method for repairing an optical arrangement, embodied as described above, after a shock load, the method including: replacing at least one stop, in which the metal foam was compressed by the shock load, by a stop (another stop), in which the metal foam is not compressed (has not yet been compressed). As described above, a substantial portion of the kinetic energy of the second component can be absorbed by the stop by virtue of the metal foam being compressed. This prevents optical or mechanical components of the optical arrangement other than the stop from being damaged or deformed in the event of a shock load and having to be possibly replaced following the shock load. Therefore, following the replacement of the stop or, where desired, a plurality of stops, the optical arrangement can be put back into operation without the optomechanics having been damaged.

Further features and advantages of the disclosure are evident from the following description of exemplary embodiments of the disclosure, with reference to the figures of the drawing, which show certain details of the disclosure, and from the claims. The individual features can be realized in each case individually by themselves or as a plurality in any desired combination in a variant of the disclosure.

BRIEF DESCRIPTION OF THE DRAWINGS

Exemplary embodiments are illustrated in the schematic drawing and are explained in the following description. In the figures:

FIG. 2a, b show schematic illustrations of a first stop of the mirror module of FIG. 1b with a metal foam for absorbing a force with a radial force component; and FIG. 3a, b show schematic illustrations of a stop of the mirror module of FIG. 1b with a metal foam for absorbing a force with an axial force component, before and after a shock load.

DESCRIPTION OF EXEMPLARY EMBODIMENTS

In the following description of the drawings, identical reference signs are used for identical or functionally identical components, respectively.

Figure 1A:
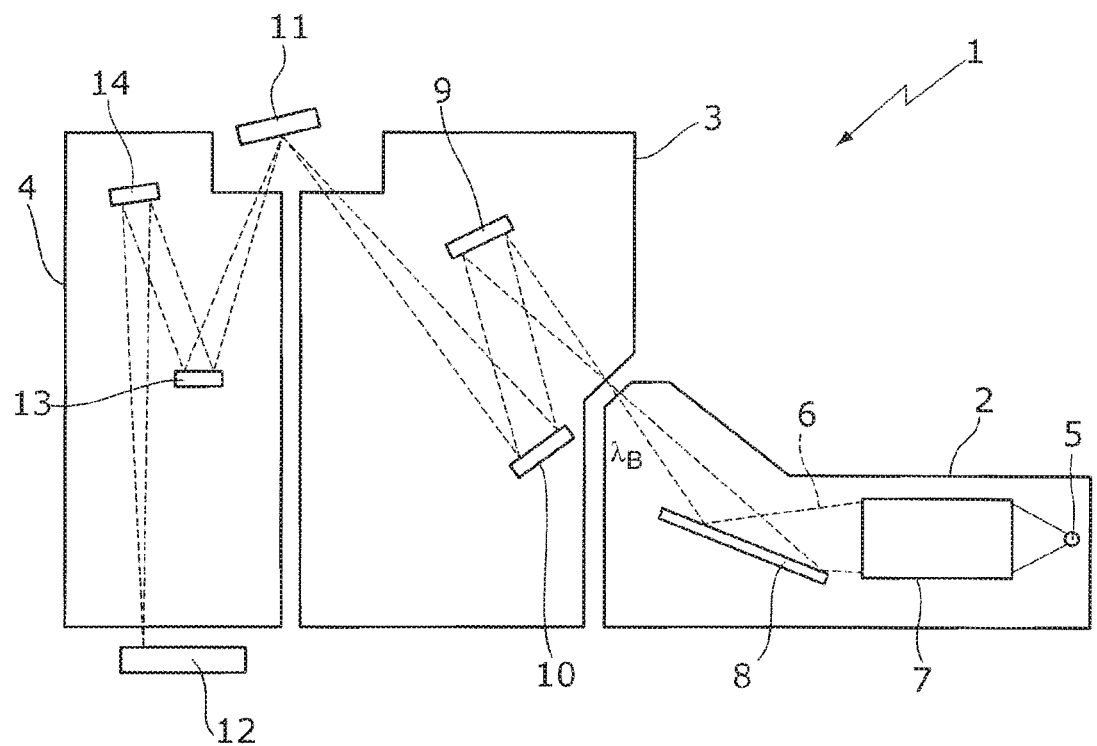
FIG. 1a shows a schematic representation of an EUV lithography apparatus with a plurality of movable components in the form of EUV mirrors.

In FIG. 1a, an EUV lithography system in the form of an EUV lithography apparatus 1 is schematically shown. The EUV lithography apparatus 1 has a beam generating system 2, an illumination system 3 and a projection system 4, which are accommodated in separate vacuum housings and are arranged one following the other in a beam path of EUV radiation 6 emerging from an EUV light source 5 of the beam shaping system 2. A plasma source or a synchrotron can serve for example as the EUV light source 5. The radiation emerging from the EUV light source 5 in the wavelength range between about 5 nm and about 20 nm is first focused in a collimator 7. With the aid of a downstream monochromator 8, the desired operating wavelength 4, which in the present example is about 13.5 nm, is filtered out. The collimator 7 and the monochromator 8 are formed as reflective optical elements.

The EUV radiation treated in the beam generating system 2 with regard to wavelength and spatial distribution is introduced into the illumination system 3, which has a first and a second reflective optical element 9, 10. The two reflective optical elements 9, 10 guide the EUV radiation 6 onto a photomask 11 as a further reflective optical element, which has a structure that is imaged via the projection system 4 on a reduced scale onto a light-sensitive substrate in the form of a wafer 12. For this purpose, a third and a fourth reflective optical element 13, 14 are provided in the projection system 4. The reflective optical elements 9, 10, 11, 13, 14 are operated in the EUV lithography apparatus 1 under vacuum conditions.

Figure 1B:
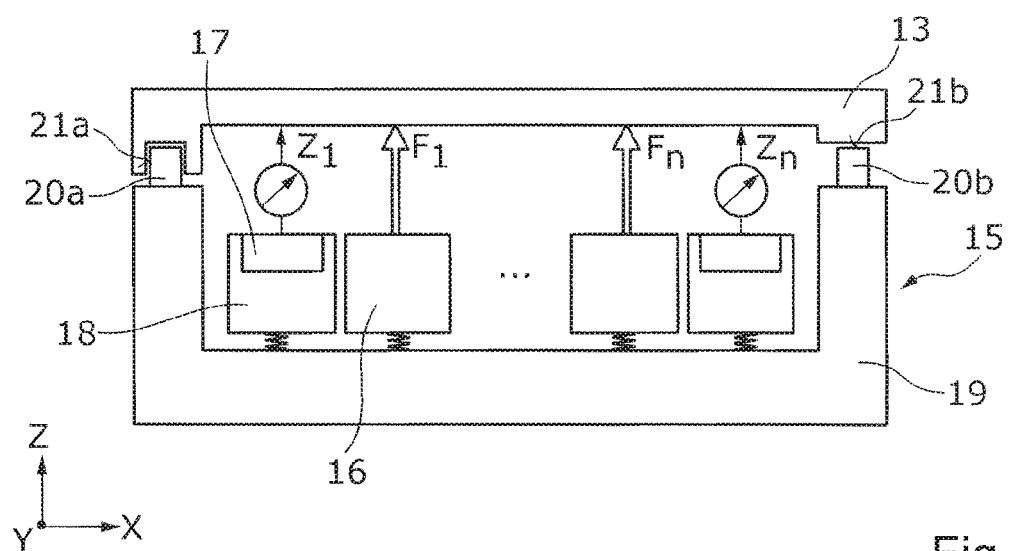
FIG. 1b shows a schematic representation of a mirror module with one EUV mirror of the lithography apparatus from FIG. 1a and also with two (end) stops for limiting its path of movement.

FIG. 1b shows, by way of example, a mirror module 15, which has a movable component in the form of the first EUV mirror 13 of the projection system 4 of FIG. 1a. The mirror module 15 has a number of mirror actuators 16, which serve for moving the EUV mirror 13 and respectively exert a force $F_1, \ldots, F_n$ on the EUV mirror 13, in order to position or align and manipulate it in all six degrees of freedom, i.e. both in all three translational degrees of freedom ($T_X$, $T_Y$, $T_Z$) and in all three rotational degrees of freedom ($R_X$, $R_Y$, $R_Z$), in three-dimensional space. In addition, sensors 17 are provided for the detection of information $Z_1, \ldots, Z_n$ concerning the position and orientation of the EUV mirror 13 in space. Both the actuators 16 and the sensors 17, to be more precise their sensor frame 18 ("sensor frame"), are/is mounted on a carrying structure or a carrying frame 19 ("force frame") in a mechanically decoupled (sprung) manner. The carrying frame 19 absorbs substantially all of the forces acting on the mirror module 15. The carrying frame 19 may extend over the entire EUV lithography apparatus 1 in which the mirror module 15 is installed, but it may also be possible that the carrying frame 19 itself is fastened or spring-mounted on a further carrying structure.

As described further above, the EUV mirror 13 is mounted on the carrying frame 19 in a mechanically decoupled or sprung manner ("floating"). Lorentz actuators, for example, can be used as actuators 16 for the mirror 13. The traveling distances or the movement space that is used during operation of the EUV mirror 13 are/is usually just a few to several 100 micrometers (µm) translationally or just a few millirads (mrad) rotationally.

In the example shown in FIG. 1b, two stops 20a,b are attached to the carrying frame 19. The stops 20a, 20b serve the purpose of avoiding unwanted and critical collisions of the EUV mirror 13 and of limiting or defining the maximum possible mechanical movement space of the EUV mirror 13. Here, the first stop 20a is embodied to limit the movement of the EUV mirror 13 in the XY-plane of an XYZ-coordinate system and, for this purpose, has a first, annular or cylindrical stop face 21a, while the second stop 20b is embodied to limit the movement of the EUV mirror 13 in the Z-direction and has a second, plane stop face 21b on its end face.

Before the EUV mirror 13 bumps into anything in the EUV lithography apparatus 1, the movement of the EUV mirror 13 is absorbed with the aid of the stops 20a,b. When the EUV lithography system 1 is transported, or else in the case of other shock loads, for example in the case of an earthquake, the uncontrolled striking of the EUV mirror 13 or the EUV mirrors 9, 10, 13, 14 on the stops 20a, 20b can lead to damage, particularly in the case of high accelerations (>2 g), if the stops 20a, 20b are designed as hard mechanical stops 20a, 20b.

In order to absorb as much of the kinetic energy of the EUV mirror 13 as possible when the EUV mirror 13 strikes against the respective stop face 21a, 21b, the two stops 20a, 20b shown in FIG. 1b each have a metal foam 22, as will be explained in more detail below in the context of FIGS. 2a,b on the basis of the first stop 20a. The first stop 20a has a cylindrical embodiment and a solid cylindrical metallic stop element 23, i.e., the latter does not consist of a foam, the first cylindrical stop surface 21a being formed on the stop element in a manner lying radially on the outside. The metal foam 22 is attached between the cylindrical stop element 23 and a connecting element 24, which likewise has a cylindrical embodiment. In the shown example, the metal foam 22 is formed from aluminum. The connecting element 24 and the stop element 23 are integrally connected to the metal foam 22 by way of a metallurgical connection, and so the first stop 20a forms a composite body. Alternatively, the connection between the metal foam 22, the stop element 23 and the connecting element 24 can be established using a joining agent, for example using an adhesive.

As may be identified in FIG. 2b, the first stop 20a is detachably connected to a fastening element of the carrying structure 19 in the form of a threaded rod 25 by virtue of the first stop 20a with the cylindrical cavity of the connecting component part 24 being plugged onto the threaded rod 25. The connecting component part 24 establishes a force-fit connection with the carrying structure 19, for example by way of a threaded nut that is screwed onto the threaded rod 25 with a close fit. The close fit is used between the connecting component part 24 and the threaded rod 25 as a cylinder-bore fit so that the stop 20a is held precisely in position, for example with a h7/h6 fit (with as little play as possible). The threaded nut, which is screwed onto the threaded rod 25, presses against the end face of the connecting component part 24 in this case, without deforming the metal foam 22. The force F, or the kinetic energy of the EUV mirror 13, which acts when the EUV mirror 13 strikes the first stop 20a in the radial direction is absorbed as completely as possible by the metal foam 22 by virtue of the metal foam 22 being compressed. The compression of the metal foam 22 is explained in more detail below on the basis of FIGS. 3a,b, with reference being made to the second stop 20b of FIG. 1b.

The second stop 20b, illustrated in FIGS. 3a,b, likewise has a cylindrical geometry. In contrast to the first stop 20a shown in FIGS. 2a,b, the solid stop component part 23 and the connecting component part 24 of the second stop 20b each are embodied in slab-shaped form and in the form of circular disks. The metal foam 22, which is disposed between the stop component part 23 and the connecting component part 24 in the axial direction, is embodied as a solid cylinder. Like in FIGS. 2a,b, the stop component part 23 and the connecting component part 24 are each connected to the metal foam 22 via a metallurgical connection, and so the second stop 20b also forms a composite body. In the case of the second stop 20b, the connecting component part 24 projects laterally beyond the metal foam 22 in the radial direction and has through-bores into which screws 26 have been inserted, the screws engaging in a threaded portion formed in the carrying structure 19 in order to detachably connect the second stop 20b to the carrying structure 19.

FIG. 3a shows the second stop 20b before the absorption of a force F acting on the second stop face 21b in the axial direction in the case of a shock effect; FIG. 3b shows the second stop 20b after the metal foam 22 has absorbed the kinetic energy of the EUV mirror 13. As is evident from a comparison between FIGS. 3a and 3b, the metal foam 22 is compressed in the axial direction when the kinetic energy is absorbed, and so the length L of the metal foam 22 has been reduced to approximately half (L/2). This allows a considerable portion of the kinetic energy of the EUV mirror 13 to be absorbed if the second stop 20b is suitably dimensioned, i.e., the kinetic energy of the EUV mirror 13 in the case of a shock load is substantially completely absorbed by the metal foam 22 and therefore cannot cause damage to the EUV mirror 13 or other components of the EUV lithography apparatus 1 on account of undesired collisions.

In order to repair the EUV lithography apparatus 1 following a shock load, for example an earthquake, or in order to put the EUV lithography apparatus back into operation, it is therefore sufficient to replace the compressed second stop 20b, shown in FIG. 3b, with a new second stop 20b, in which the metal foam 22 has not been compressed and which has its original length L.

The EUV lithography apparatus 1 can therefore be put back into operation following a shock load without other component parts having to be replaced for this purpose. It is understood that the stops 20a, 20b can be used not only to limit the movement path of a component in the form of an EUV mirror 13 but also to limit the movement path of other movable components disposed in an optical arrangement. By way of example, the second component, which is movable relative to the first component 19, can be a mirror system, e.g., the illumination system 3 of FIG. 1a, or the housing thereof, which can be moved relative to a carrying structure 19 (base frame). Since such a (mirror) system has a comparatively large mass, a very complex damping system involving much installation space, for example a damping system in the form of a hydraulic damping system, would be involved without the use of the stops 20a, 20b, described herein, with the metal foam serving for energy dissipation. Such a damping system may possibly be completely dispensed with if use is made of the stops 20a, 20b.

Instead of the EUV lithography apparatus 1 described further above, movable components of another optical arrangement, for example a DUV lithography apparatus, can also be protected from shock loads with the aid of the stops described further above. It is understood that the stops need not necessarily have a cylindrical embodiment and that the direction of force of the force exerted by the respective movable component on the stop face need not necessarily be oriented perpendicular to the stop surface.

What is claimed is:

1. An optical arrangement, comprising:
   a first component;
   a second component movable relative to the first component;
   a stop comprising a stop face configured to limit movement of the second component in relation to the first component,
   wherein the stop comprises a metal foam, and
   wherein the optical arrangement is configured so that, when the second component strikes the stop face, the metal foam absorbs kinetic energy from the second component.

2. The optical arrangement of claim 1, wherein the first component comprises a carrying frame, and the second component comprises a mirror.

3. The optical arrangement of claim 1, wherein the first component comprises a carrying frame, and the second component comprises a housing.

4. The optical arrangement of claim 1, wherein the stop is detachably connected to the first component.

5. The optical arrangement of claim 1, wherein the stop is detachably connected to the first component via a screw connection.

6. The optical arrangement of claim 1, wherein the stop comprises a solid part connected to the first component.

7. The optical arrangement of claim 1, wherein the stop comprises a metallic part connected to the first component.

8. The optical arrangement of claim 1, wherein the stop face is solid.

9. The optical arrangement of claim 1, wherein the stop face comprises a metallic material.

10. The optical arrangement of claim 1, wherein the stop comprises a metallic connecting component connected to the first component, and the stop face comprises a metallic material.

11. The optical arrangement of claim 1, wherein the metal foam is between the connecting component and the stop face.

12. The optical arrangement of claim 11, wherein the stop face is cylindrical, and the metallic connecting component is cylindrical.

13. The optical arrangement of claim 11, wherein the stop face is slab-shaped, and the metallic connecting component is slab-shaped.

14. The optical arrangement of claim 1, wherein the stop comprises a solid part connected to the first component, and the solid part is integrally connected to the metal foam.

15. The optical arrangement of claim 1, wherein the stop comprises a stop component part integrally connected to the metal foam.

16. The optical arrangement of claim 1, wherein the metal foam comprises aluminum.

17. A system, comprising:
    the optical arrangement of claim 1,
    wherein the apparatus is a lithography projection system.

18. An apparatus, comprising:
    the optical arrangement of claim 1,
    wherein the apparatus is a lithography apparatus.

19. A method for repairing an optical arrangement which comprises a first component, a second component movable relative to the first component, and a stop comprising a stop face configured to limit movement of the second component in relation to the first component, the stop comprising a metal foam, the method comprising:
    replacing the stop with a different stop which also comprises a metal foam,
    wherein the optical arrangement is configured so that, when the second component strikes a stop face of the different stop, the metal foam of the different stop absorbs kinetic energy from the second component.

* * * * *

UNITED STATES PATENT AND TRADEMARK OFFICE
CERTIFICATE OF CORRECTION

PATENT NO. : 11,467,500 B2
APPLICATION NO. : 16/814169
DATED : October 11, 2022
INVENTOR(S) : Joachim Hartjes It is certified that error appears in the above-identified patent and that said Letters Patent is hereby corrected as shown below:

In the Specification

Column 6, Line 40, delete "FIG." insert --FIGS.--.

Column 6, Line 43, delete "FIG." insert --FIGS.--.

Signed and Sealed this
Thirteenth Day of December, 2022

Katherine Kelly Vidal
*Director of the United States Patent and Trademark Office*